(12) United States Patent
Bonar et al.

(10) Patent No.: US 10,381,513 B2
(45) Date of Patent: Aug. 13, 2019

(54) ENHANCED LIGHT EXTRACTION

(71) Applicant: Facebook Technologies, LLC, Menlo Park, CA (US)

(72) Inventors: James Ronald Bonar, Erskine (GB); Zheng Gong, Scotstoun (GB); James Small, Glasgow (GB); Gareth John Valentine, York (GB); Richard I. Laming, Edinburgh (GB)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

(21) Appl. No.: 15/847,760

(22) Filed: Dec. 19, 2017

(65) Prior Publication Data

US 2018/0182918 A1 Jun. 28, 2018

Related U.S. Application Data

(63) Continuation of application No. 15/351,243, filed on Nov. 14, 2016, now Pat. No. 9,887,319, which is a (Continued)

(30) Foreign Application Priority Data

Feb. 9, 2012 (GB) .................................. 1202222.4

(51) Int. Cl.
*H01L 33/62* (2010.01)
*H01L 33/60* (2010.01)
(Continued)

(52) U.S. Cl.
CPC .......... *H01L 33/06* (2013.01); *H01L 33/0025* (2013.01); *H01L 33/0066* (2013.01); (Continued)

(58) Field of Classification Search
CPC ........ H01L 33/20; H01L 33/32; H01L 33/22; H01L 33/08; H01L 33/38; H01L 33/44; (Continued)

(56) References Cited

U.S. PATENT DOCUMENTS 6,229,160 B1    5/2001  Krames et al.
6,429,462 B1 *  8/2002  Shveykin ............. H01L 27/156
                                                            257/101
(Continued)

FOREIGN PATENT DOCUMENTS

EP    1 221 725       7/2002
EP    1 750 310 A2    2/2007
(Continued)

OTHER PUBLICATIONS

PCT International Search Report, PCT Application No. PCT/GB2013/050305, dated May 16, 2013, 4 pages.
(Continued)

*Primary Examiner* — Zandra V Smith
*Assistant Examiner* — Jeremy J Joy
(74) *Attorney, Agent, or Firm* — Fenwick & West LLP

(57) ABSTRACT

There is herein described light generating electronic components with improved light extraction and a method of manufacturing said electronic components. More particularly, there is described LEDs having improved light extraction and a method of manufacturing said LEDs.

18 Claims, 11 Drawing Sheets

Related U.S. Application Data continuation of application No. 14/377,804, filed as application No. PCT/GB2013/050305 on Feb. 11, 2013, now Pat. No. 9,559,250.

(51) Int. Cl.

| | | |
|---|---|---|
| *H01L 33/58* | (2010.01) | |
| *H01L 33/46* | (2010.01) | |
| *H01L 33/42* | (2010.01) | |
| *H01L 33/40* | (2010.01) | |
| *H01L 33/38* | (2010.01) | |
| *H01L 33/32* | (2010.01) | |
| *H01L 33/24* | (2010.01) | |
| *H01L 33/20* | (2010.01) | |
| *H01L 33/08* | (2010.01) | |
| *H01L 33/06* | (2010.01) | |
| *H01L 25/075* | (2006.01) | |
| *H01L 33/00* | (2010.01) | |

(52) U.S. Cl.
CPC .......... *H01L 33/0075* (2013.01); *H01L 33/08* (2013.01); *H01L 33/20* (2013.01); *H01L 33/24* (2013.01); *H01L 33/32* (2013.01); *H01L 33/38* (2013.01); *H01L 33/405* (2013.01); *H01L 33/42* (2013.01); *H01L 33/46* (2013.01); *H01L 33/58* (2013.01); *H01L 33/62* (2013.01); *H01L 25/0753* (2013.01); *H01L 33/60* (2013.01); *H01L 2924/0002* (2013.01); *H01L 2933/0016* (2013.01); *H01L 2933/0025* (2013.01); *H01L 2933/0058* (2013.01); *H01L 2933/0066* (2013.01)

(58) Field of Classification Search
CPC ..... H01L 25/0753; H01L 33/46; H01L 33/42; H01L 33/10; H01L 33/36; H01L 33/40; H01L 33/48–33/486
See application file for complete search history.

(56) References Cited

U.S. PATENT DOCUMENTS

| | | | | |
|---|---|---|---|---|
| 6,495,862 | B1* | 12/2002 | Okazaki | H01L 33/20 257/103 |
| 6,936,859 | B1* | 8/2005 | Uemura | H01L 33/405 257/103 |
| 7,053,419 | B1 | 5/2006 | Camras et al. | |
| 7,179,671 | B2* | 2/2007 | Okazaki | H01L 33/40 257/100 |
| 7,419,839 | B2 | 9/2008 | Camras et al. | |
| 7,518,149 | B2 | 4/2009 | Maaskant et al. | |
| 7,902,566 | B2 | 3/2011 | Paolini et al. | |
| 8,449,128 | B2* | 5/2013 | Ko | G02B 19/0066 362/84 |
| 8,581,280 | B2* | 11/2013 | Fehrer | H01L 33/20 257/103 |
| 8,602,832 | B2* | 12/2013 | Hsieh | H01L 33/0079 445/24 |
| 2002/0030194 | A1 | 3/2002 | Camras et al. | |
| 2002/0141006 | A1* | 10/2002 | Pocius | G02B 5/32 359/15 |
| 2002/0197764 | A1* | 12/2002 | Uemura | H01L 33/22 438/79 |
| 2003/0127654 | A1 | 7/2003 | Eisert et al. | |
| 2003/0232455 | A1 | 12/2003 | Tanaka | |
| 2004/0048429 | A1* | 3/2004 | Baur | H01L 33/02 438/200 |
| 2004/0056254 | A1* | 3/2004 | Bader | H01L 33/0079 257/79 |
| 2004/0070337 | A1* | 4/2004 | Goh | H01L 33/60 313/512 |
| 2004/0155565 | A1* | 8/2004 | Holder | A61B 1/0669 313/113 |
| 2004/0184499 | A1 | 9/2004 | Kondo | |
| 2005/0110033 | A1* | 5/2005 | Heremans | H01L 33/025 257/98 |
| 2005/0199885 | A1* | 9/2005 | Hata | H01L 33/20 257/79 |
| 2005/0199898 | A1* | 9/2005 | Lin | H01L 33/20 257/79 |
| 2006/0038190 | A1* | 2/2006 | Park | H01L 33/007 257/95 |
| 2006/0071226 | A1* | 4/2006 | Kojima | H01L 33/405 257/98 |
| 2006/0273341 | A1 | 12/2006 | Lee et al. | |
| 2007/0001186 | A1 | 1/2007 | Murai et al. | |
| 2007/0102721 | A1 | 5/2007 | DenBaars et al. | |
| 2007/0145402 | A1 | 6/2007 | Eisert et al. | |
| 2009/0267096 | A1* | 10/2009 | Kim | H01L 33/0079 257/98 |
| 2009/0290355 | A1* | 11/2009 | Kim | H01L 33/405 362/307 |
| 2010/0120183 | A1* | 5/2010 | Kim | H01L 33/0079 438/29 |
| 2010/0166983 | A1 | 7/2010 | Cho et al. | |
| 2012/0049213 | A1* | 3/2012 | Chen | H01L 25/0753 257/89 |
| 2013/0228808 | A1 | 9/2013 | Lester | |
| 2014/0034984 | A1 | 2/2014 | Schweeger et al. | |

FOREIGN PATENT DOCUMENTS

| | | |
|---|---|---|
| JP | 2006-128227 | 5/2006 |
| JP | 2007-311420 A | 11/2007 |

OTHER PUBLICATIONS

PCT Written Opinion, PCT Application No. PCT/GB2013/050305, dated May 28, 2013, 6 pages.
United States Office Action, U.S. Appl. No. 14/377,804, dated May 6, 2016, 14 pages.
United States Office Action, U.S. Appl. No. 14/377,804, dated Jul. 9, 2015, 15 pages.
United States Office Action, U.S. Appl. No. 15/351,243, dated Apr. 7, 2017, 18 pages.

\* cited by examiner

Grid array

"Hexagonal" array

ENHANCED LIGHT EXTRACTION

CROSS REFERENCE TO RELATED APPLICATIONS

This application is a continuation of U.S. application Ser. No. 15/351,243, filed Nov. 14, 2016, which is a continuation of U.S. application Ser. No. 14/377,804, filed Aug. 8, 2014, now U.S. Pat. No. 9,559,250, which is a National Phase application of International Application No. PCT/GB2013/050305, filed Feb. 11, 2013, which claims the benefit of United Kingdom Application No. 1202222.4, filed Feb. 9, 2012, each incorporated by reference in its entirety.

FIELD OF THE INVENTION

The present invention relates to light generating electronic components with improved light extraction and a method of manufacturing said electronic components. More particularly, the present invention relates to light emitting diodes (LEDs) with improved light extraction and a method of manufacturing said LEDs.

BACKGROUND OF THE INVENTION

There are well-known problems in extracting light from LEDs formed in semiconductor structures such as Gallium Nitride (GaN).

For GaN LEDs, it is well known in the field that to grow thick and highly conductive p-type AlInGaN layers is difficult especially compared to that of n-type layers. Thus, typically the light emitting area, typically quantum wells (QW), is no more than 500 nm from the top surface. Commonly, devices are used in a flip-chip format so that light exits through a polished transparent sapphire substrate. The light emitted is isotropic and reflects off the top surface which is co-planar to the QW. Consequently, the angle of reflection is not altered at this interface and thus the reflected angle is not deliberately modified to be lower than that of the critical angle at the device interfaces.

Light generated at the quantum well in an LED structure is emitted in all directions. When the light reaches the boundary of a GaN or sapphire surface there is a change in refractive index of the material. If the light ray reaching the interface has an angle within an "escape cone" it will be partially emitted from the device. There are small Fresnel losses which change with angle so not all the light is transmitted. As the angle of incidence approaches or exceeds the escape cone, light will be reflected back into the device and may be absorbed as heat. For a GaN-air interface the critical angle is only 21°, 24° and 25° at the wavelengths of 365, 450 and 520 nm, respectively.

Gallium Nitride LEDs have been demonstrated previously and are commercially available. LED structures can be top emitting or can emit through a transparent substrate or have the substrate removed to emit at the semiconductor interface. Most commercially available LEDs are planar structures. Previous near parabolic structures in Gallium Arsenide are well-known and have been reported with a flat top to the structure but within a limited parameter space (e.g. U.S. Pat. No. 7,518,149 B2, which is incorporated herein by reference). Use of sloped sidewalls of micro-LED devices for improved manufacturing and increased light extraction has been demonstrated by the University of Strathclyde (e.g. U.S. Pat. No. 7,598,149 B2, which is incorporated herein by reference).

However, prior art devices have a number of limitations. Prior art involving the etching of parabolic shaped structures on micro-LED devices has been demonstrated in a configuration applicable to a Gallium Arsenide structure. For Gallium Nitride devices, the quantum well is typically only −0.3 to 0.5 microns below the top surface. In this configuration a flat truncated top would result in a small useable active area for optimal light extraction and consequently the need to manufacture a very small light emitting volume in comparison to that of the overall structure. There are practical limitations to the mesa height for such structures and consequently the fill-factor for the active region becomes negligible to enable efficient extraction. Integrating a hybrid shaped transparent structure on the top of the device can resolve these issues and provide further flexibility as a parabolic design may not necessarily be the optimum shape.

It is an object of at least one aspect of the present invention to obviate or mitigate at least one or more of the aforementioned problems.

It is a further object of at least one aspect of the present invention to provide improved LEDs and micro-LEDs with improved light extraction.

It is a further object of at least one aspect of the present invention to provide an improved method for manufacturing LEDs and micro-LED arrays with improved light extraction.

It is a further object of at least one aspect of the present invention to provide an improved method for providing a pattern programmable micro-display.

SUMMARY OF THE INVENTION

According to a first aspect of the present invention there is provided a light emitting structure comprising:
  a light emitter capable of emitting electromagnetic radiation;
  an integrated transparent electrically conductive layer located adjacent the light emitter through which the electromagnetic radiation may be transmitted;
  wherein the integrated transparent electrically conductive layer improves the amount of light capable of being extracted from the light emitting structure.

The present invention therefore resides in the provision of increasing and improving the amount of radiation that can be extracted and used from the light emitting structure.

The light emitting structure may comprise a side wall which may be inclined to enhance light extraction.

The light emitting structure may also incorporate a textured surface to enhance light extraction.

The light emitting structure may be an LED e.g. a micro-LED.

The light emitter may be any device capable of emitting radiation. Preferably, the light emitter may be a quantum well structure. The quantum well region may be about 10-100 nm thick and typically about 30 nm thick. In particular embodiments, the quantum well region may be made from InGaN/GaN.

The electromagnetic radiation emitted from the light emitter may be visible and may have, but is not restricted to a wavelength of about 300-700 nm.

The integrated transparent conductive cap layer may be dome shaped in cross-section in either one or two dimensions and may be formed with the rest of the LED structure during fabrication. The dome-cross-sectioned cap may therefore form a transparent area on top of the light emitting structure e.g. LED. The cap may be formed from a transparent conductive layer such as, but not limited to Indium Tin Oxide (ITO) or doped conductive Zinc-Oxide such as aluminium doped zinc oxide (AZO).

The integrated transparent conductive layer (e.g. transparent cap) may be an integral part of the structure and forms part of the ohmic contact to the device anode.

The integrated transparent conductive layer (e.g. transparent cap) material may be chosen to have a suitable refractive index and thickness to reduce Fresnel reflections with, for example, the GaN interface.

The integrated transparent conductive layer (e.g. transparent cap) may be conical, domed or aspheric in cross-section in one or both directions. Preferably, the cap cross-section may be parabolic or elliptical in shape. Alternatively, the integrated transparent conductive layer (e.g. transparent cap) may have a micro Fresnel lens shape.

The integrated transparent conductive layer (e.g. transparent cap) may help shape current distribution in order to reduce surface recombination at the outer periphery of the quantum well The light emitting structure may also comprise an integrated reflective surface located adjacent the transparent conductive layer which is capable of reflecting the visible radiation transmitted through the transparent conductive layer back into the light emitting structure.

The integrated reflective surface may comprise a metal contact layer that may also form part of a reflective second surface mirror structure in the light emitting structure.

The light emitting structure (e.g. LED structure) may comprise a single isolated P-N diode or may consist of multiple structures with a common p and/or n connection.

The light emitting structure may also include side-walls coated in an electrically insulating layer, e.g. oxide covered side walls.

The integrated reflective surface (e.g. metal layer) may form part of an interconnect structure.

There may be a single LED or an array of LEDs or multiple LED emitter sites on one area.

In further embodiments a top emitting device may be formed where the transparent conductive layer (e.g. transparent cap) is transparent so that light emitted upwards is refracted in a manner that reduces the divergence of light so that it is focussed or collimated. In this embodiment the cap may be conductive and may form an ohmic contact to Gallium Nitride. In this embodiment, the cap may also be formed from transparent polymer or other transparent material in addition to the ohmic contact layer. In this embodiment the light emitting structure may comprise a reflecting shaped structure integrated on top of the light emitting structure e.g. an LED. Furthermore, the top-emitting device may be formed where the thickness of the transparent conductive layer adjacent to the shaped structure (e.g. spherical lens) is of sufficient thickness for providing electrical contact and designed to reduce Fresnel reflections (e.g. −X/4 anti-reflection layer). To enhance light extraction from the top emitting structure a reflective layer or layers is formed on the lower surface of the device e.g. transparent substrate so light is reflected back to the shaped conductive structures (ideally the incident light is then close to normal at the exit surface). The adjacent conductive layers are designed and fabricated to provide anti-reflection properties. The above combined with the relatively low absorption coefficient of the semiconductor e.g. GaN is designed to increase light extraction from the device.

The cap structure may be formed from a transparent polymer or a shaped oxide layer or transparent conductive layer. The cap structure may be conical in cross-section or shaped as a parabolic, aspheric or a Fresnel structure in one or both dimensions.

The cap structure may be formed on top of a conductive layer providing an ohmic contact to the device anode.

The conductive layer may be, but is not limited to indium tin oxide or a gold alloy. The cap structure may be bordered by a metal contact layer that may also form part of a reflective structure.

The metal layer may form part of an interconnect structure.

There may be a single LED or an array or LEDs or multiple LED emitter sites on one area.

In this embodiment an integrated shaped transparent conductive cap is formed on top of an LED in order to extend the light path above the light emitting area so that a larger number of rays are reflected from angled sidewalls which are preferably of high reflectance. Such a scheme can be designed to increase the number of rays to have incidence angles below the critical angle at the device interfaces, thus increasing light extraction. The formation of the shaped transparent conductive cap with high reflectance surface will result in a shape suitable to guide the light in a controlled manner; this shape may be conical, parabolic, elliptical or spherical in cross-section. The conductive cap with reflecting surface may also take the shape of a mirrored Fresnel structure. In a preferred embodiment the cross-sectional shape is parabolic in nature so that the light is near collimated, or any other shape that is appropriate. The sidewall angle of the emitter and the aspect ratio of the emitter diameter to overall mesa structure height are also considered.

In a further alternative embodiment the light emitter in the form of a quantum well area may be reduced to improve confinement of the light emission area to the centre of a pixel allowing more effective beam extraction from the shaped pixel reflector. For a parabolic shape the light will be near collimated. In this form, a p-GaN region and quantum well may be selectively exposed to a plasma treatment. This has the effect of stopping light emission from the treated area i.e. reducing the size of the active layer such that the light generated is close to the middle area of the active area. For the parabolic cross-section reflector this would coincide with the focal point. In this embodiment the application of the reduced quantum well area may be utilised with a conventional 'flat' topped structure as long as the sidewalls are sloped, but preferably should be used with a cap structure.

In a further embodiment the light emitting face may be modified to enhance light extraction. In one approach the sapphire surface may be textured by etching to form a roughened or a nano-textured surface which may for example involve pattern transfer of nano spheres or the formation of 2D photonic crystal structures.

In a second approach the sapphire carrier may be removed by laser lift off exposing the GaN buffer layer, this enables the GaN layer to be structured by etching where it may be patterned to form refractive, diffractive, Fresnel or 2D photonic crystal structures. It is also possible that the carrier may be silicon (GaN on silicon). Techniques may be employed to remove the silicon from the required areas.

In a third approach the GaN buffer layer may be removed by etching thus exposing the n-GaN layer. Deposition of a transparent conductive layer such as Indium Tin Oxide (ITO) provides a conductive layer allowing the device to act as a vertical LED. In this form the ITO layer may be patterned to form refractive, diffractive, Fresnel or 2D photonic crystal structures. The refractive index of the transparent conductive layer should be chosen to minimise reflection at the GaN interface.

According to a second aspect of the present invention there is provided a method of manufacturing a light emitting structure comprising:

provided a light emitter capable of emitting electromagnetic radiation;

providing an integrated transparent electrically conductive layer located adjacent the light emitter through which the electromagnetic radiation may be transmitted;

wherein the integrated transparent electrically conductive layer improves the amount of light capable of being extracted from the light emitting structure.

The light emitting structure may be as defined in the first aspect and may, for example, be an LED.

The method of manufacturing the light emitting structure (e.g. LED) may comprise providing a transparent conductive oxide (TCO) layer, a GaN layer and a sapphire layer. The GaN layer may be coated with the TCO layer with, for example, a refractive index greater than 1.8, preferably greater than 2.0 and ideally matched to the semiconductor at the operating wavelength e.g. ~2.4 for GaN at 450 nm.

A photoresist pattern may then be formed in in the areas to be defined as emitters by photolithography.

The photoresist pattern may then be baked to allow it to reflow into a rounded form.

The photoresist pattern may then be transferred by a dry etch technique such as inductively coupled plasma etch (ICP) or Reactive Ion Etching (RIE) into the TCO layer and then into the GaN layer. The photoresist pattern layer may be sacrificial and erodes during the etch process.

The light emitter structure may then be covered with a thin insulating layer such as silicon dioxide or silicon nitride.

The insulating layer on top of the TCO lens may then be uncovered to enable the p-contact to be formed.

Interconnect metal is deposited. This may also act as a mirror to reflect light downwards in a back emitting device.

BRIEF DESCRIPTION OF THE DRAWINGS

Embodiments of the present invention will now be described, by way of example only, with reference to the accompanying drawings in which.

BRIEF DESCRIPTION

Generally speaking, the present invention resides in the provision of using a transparent (e.g. visible light transparent) conductive cap structure on top of a light emitting diode to improve light extraction and the amount of light emitted.

Figure 1:
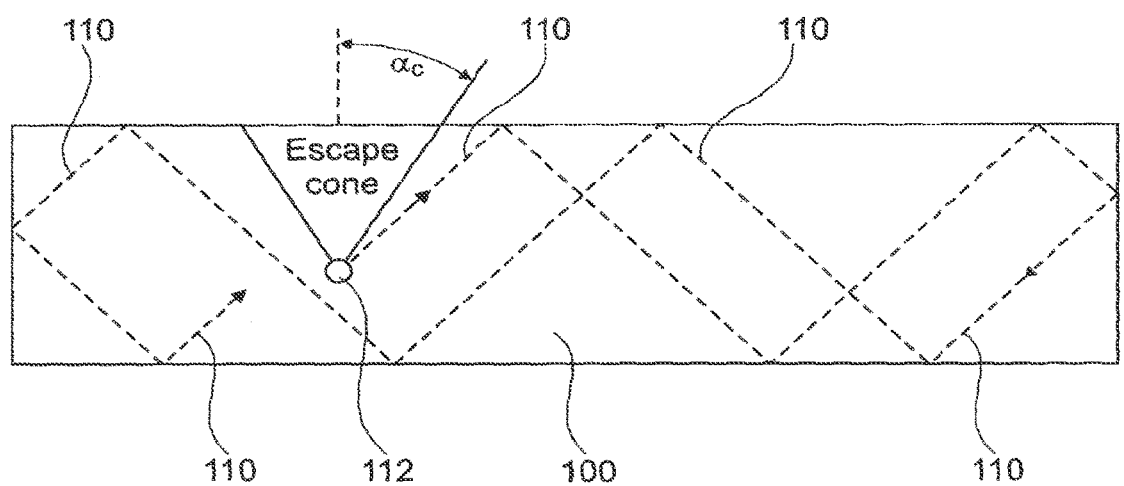
FIG. 1 is a representation of a required 'escape cone' which light must fall within to be able to exit a light emitting device structure.

FIG. 1 is representation of light 110 being generated in an LED structure 100 according to the prior art. The light is emitted from a point source 112 in a quantum well. FIG. 1 shows that the light 110 is emitted in all directions and is shown to have an escape cone with an angle $\alpha_c$. When the light reaches the boundary of, for example, the GaN or sapphire surface there is a change in refractive index of the material. If the light ray 110 reaching the interface has an angle within the "escape cone" it will be emitted from the LED structure 100. If the angle of incidence is greater than the escape cone the light 110 will be reflected back into the LED structure 100 and may be absorbed as heat. For the GaN-air interface the critical angle is only 21°, 24° and 25° at the wavelengths of 365, 450 and 520 nm, respectively. It is beneficial to have light below this critical angle. This can be achieved by quasi collimating or directing the light in order to reduce the probability of internal reflection and so improve the efficiency of the device.

Figure 2:
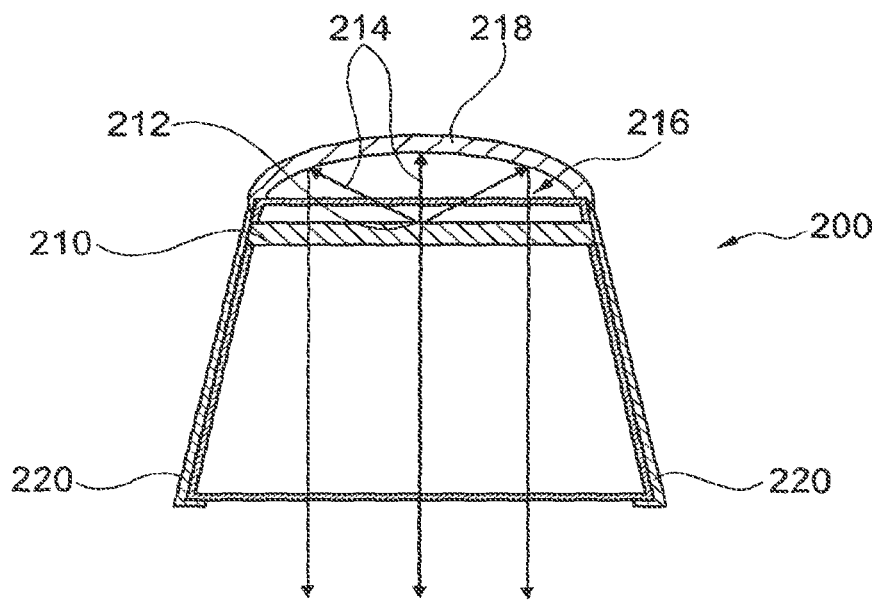
FIG. 2 is a representation of a light emitting structure comprising an integrated dome shaped transparent cap according to an embodiment of the present invention.

FIG. 2 is representation of an integrated light emitting structure 200 of the present invention. The light emitting structure may be an LED e.g. a micro-LED. As shown in FIG. 2 the light emitting structure 200 has a quantum well region 210 from which light 214 is emitted from a point source 212. The quantum well region 210 may be about 100 nm thick and may be made from InGaN. Emitted light rays 214 are shown passing through a transparent dome cross-sectioned cap 216. The dome cross-section cap 216 is integrally formed with the rest of the LED structure during fabrication. This is discussed in more detail below. The LED structure may consist of a single isolated p-n diode or may consist of multiple structures with a common p and/or n connections. The light 214 is shown being reflected from a metal contact/curved mirror 218 back into the main body of the light emitting structure 200. The light emitting structure 200 is also shown to have oxide covered side walls 220. The transparent cap 216 may in some embodiments be contoured so that light 214 emitted towards the transparent cap 216 is reflected back towards the emitting surface in a manner that reduces the divergence of light. In these types of embodiments the shaped transparent structure 216 is conductive and may form an ohmic contact to a Gallium Nitride layer. The cap 216 and the sidewall 220 of the Gallium Nitride emitter may both be contoured by etching to leave a suitable one or two dimensional cross-sectional shape which may be sloped, conical, domed parabolic, or alternatively an aspheric structure. The reflecting surface 218 may also be shaped to act as a Fresnel mirror. The reflective second surface mirror surface may extend to include the side wall below the quantum well. In an ideal device the distance from the top of the structure to the bottom of the sidewall will typically be between 1 and 10 microns. The diameter of the individual emitter should be less than 2× the height e.g. a device of 2 microns height will have emitters of 4 microns diameter or less The material chosen for the cap 216 should ideally have a high refractive index, normally greater than 1.5 and preferably more than 2.0 in order to reduce losses at the interface with the GaN layer. In an ideal device it should have a refractive index of –2.4 to match GaN. The sidewall angle of the structure should be chosen according to the type of cap shape chosen and the refractive index of the material used but should normally be greater than 5° from vertical, and preferably 45±30° from vertical.

Figure 3A:
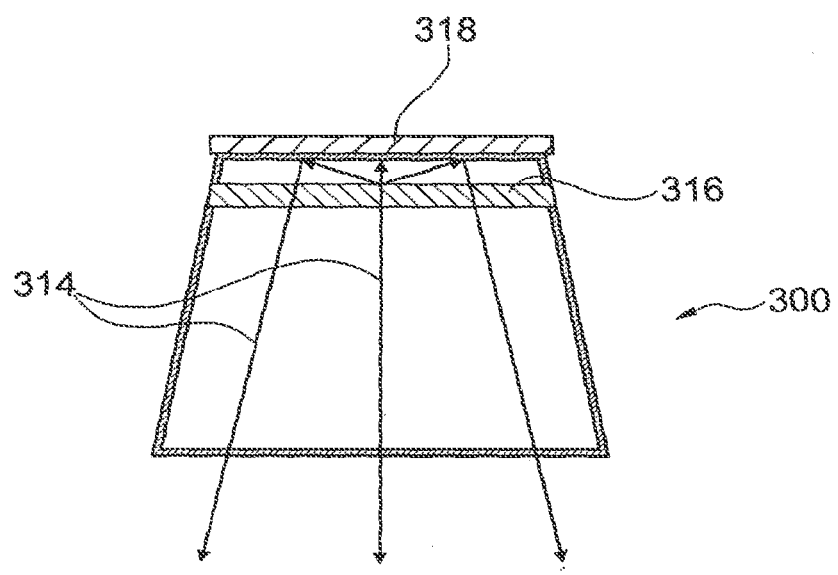
FIG. 3a is a representation of a light emitting structure where emitted light rays are reflected back against a metal contact/mirror according to the current state of the art.

FIG. 3a is a representation of a light emitting structure 300 where emitted light rays 314 are reflected back against a metal contact/mirror 318. There is also a quantum well region 316.

Figure 3B:
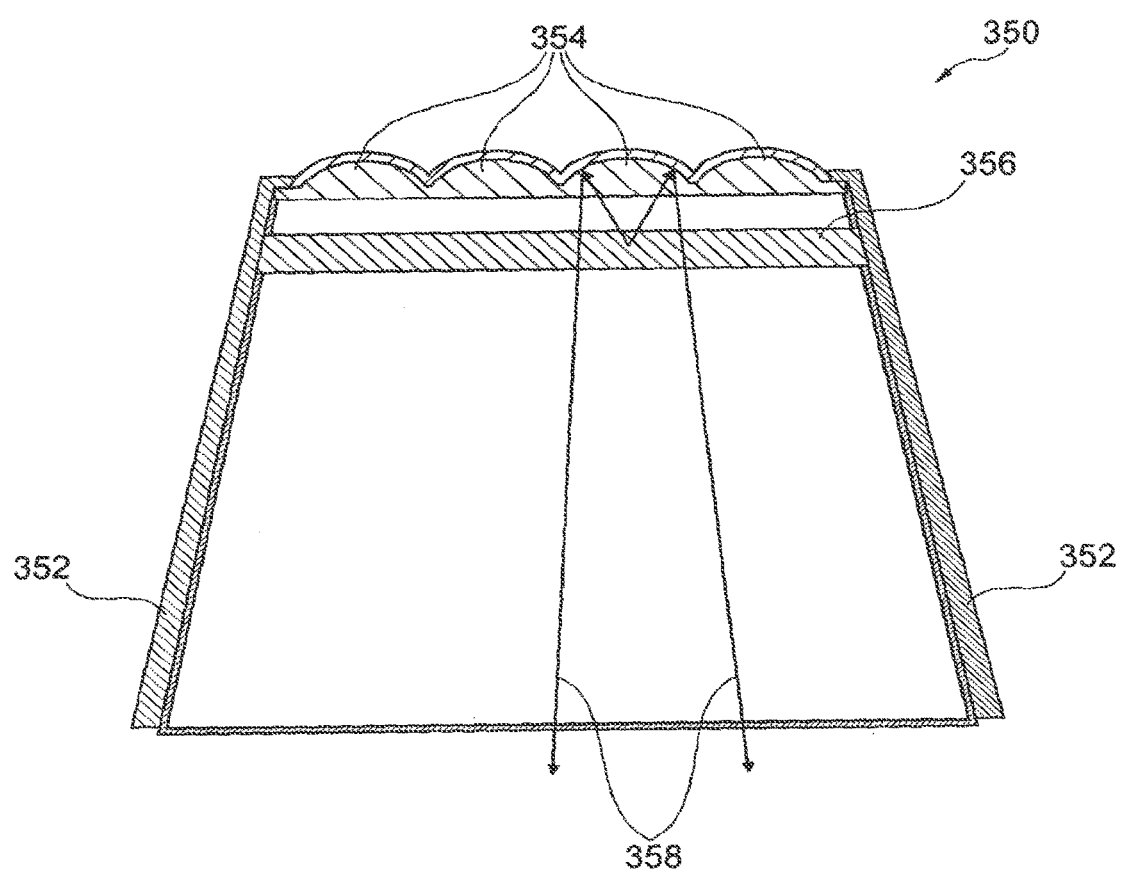
FIG. 3b is a representation of a light emitting structure comprising a series of integrated dome shaped transparent cap according to an embodiment of the present invention.

FIG. 3b is a representation of a light emitting structure 350 comprising a series of integrated dome shaped transparent caps 354. There are also sidewalls 352 and a quantum well region 356. Light rays 358 are show exiting the light emitting structure 350.

Figure 4A:
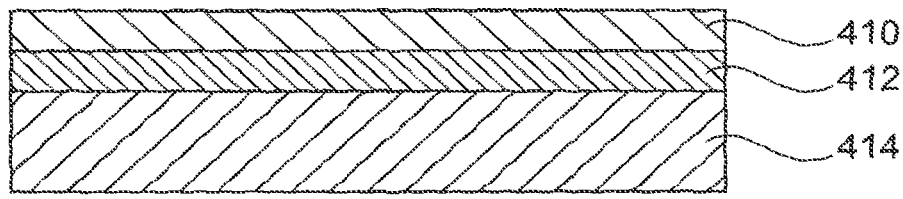
FIGS. 4a-4h represent a method of manufacturing a light emitting structure according to an embodiment of the present invention.

FIGS. 4a-4h represent a method of manufacturing a light emitting structure according to an embodiment of the present invention. In FIG. 4a there is shown a transparent conductive oxide (TCO) layer 410, a GaN layer 412 and a sapphire layer 414. Sapphire substrates are therefore used with a proprietary GaN layer structure which is chosen to be suitable for the process used and the wavelength of emission required. The GaN layer 412 is coated with a TCO layer 410 with, for example, a refractive index greater than 1.8 and preferably greater than 2.0.

Figure 4B:
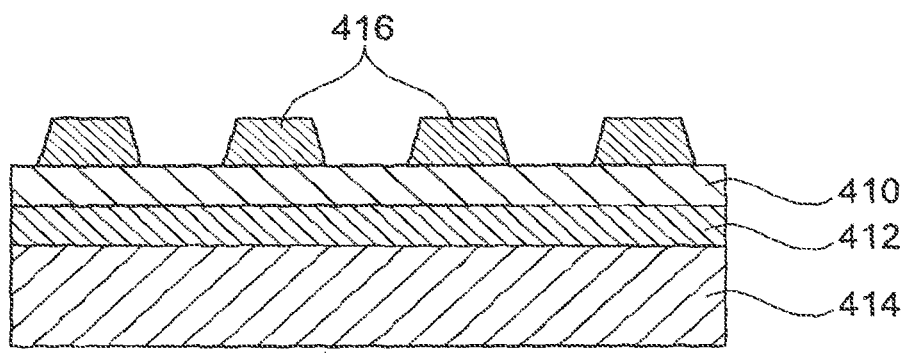

In FIG. 4b there is shown a photoresist pattern 416 being formed in the areas to be defined as emitters by photolithography.

Figure 4C:
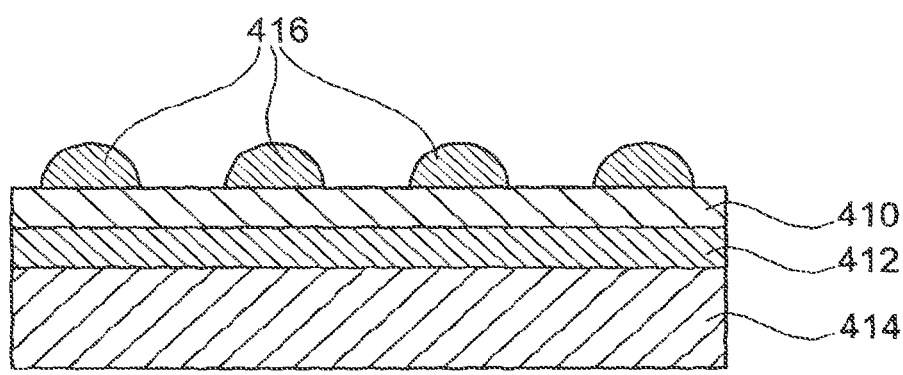

In FIG. 4c the photoresist pattern 416 is baked to allow it to reflow into a rounded form.

Figure 4D:
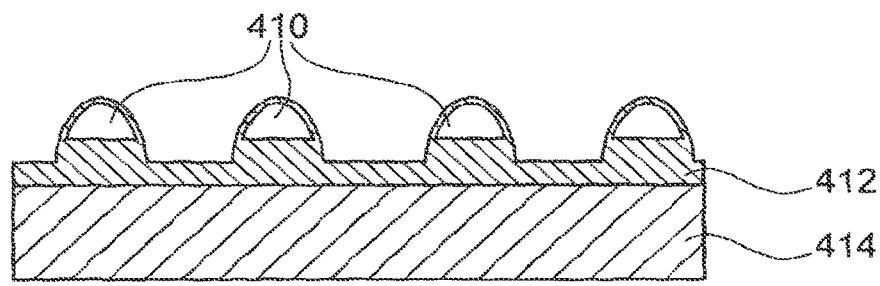

In FIG. 4d the photoresist pattern 416 is transferred by a dry etch technique such as inductively coupled plasma etch (ICP) or Reactive Ion Etching (RIE) into the TCO layer 410 and then into the GaN layer 412. The photoresist pattern layer 416 will be sacrificial and erodes during the etch process.

Figure 4E:
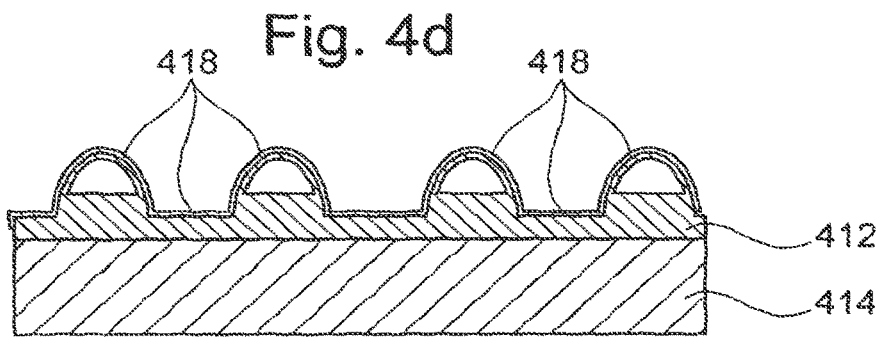

In FIG. 4e the emitter structure is covered with a thin insulating layer 418 such as silicon dioxide or silicon nitride.

Figure 4F:
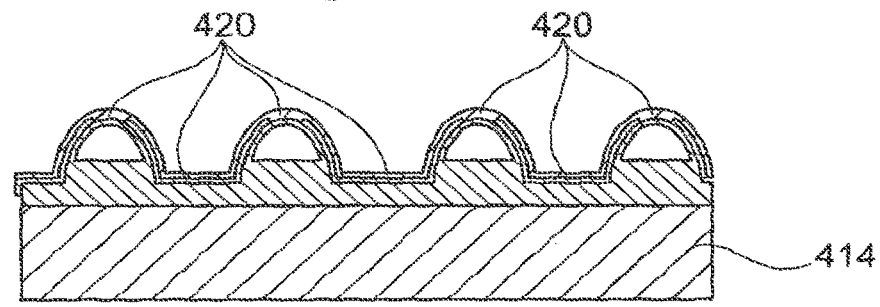

In FIG. 4f the insulating layer 418 on top of the TCO cap is uncovered to enable the p-contact to be formed. An interconnect metal layer 420 is then deposited. The interconnect metal layer 420 may also act as a mirror to reflect light downwards in a back emitting device.

Figure 4G:
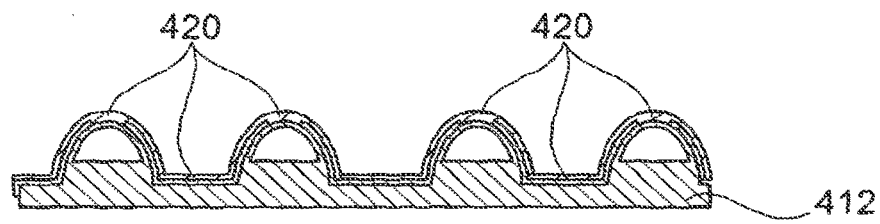

In FIG. 4g the sapphire carrier has been removed, preferably using a laser lift off technique.

Figure 4H:
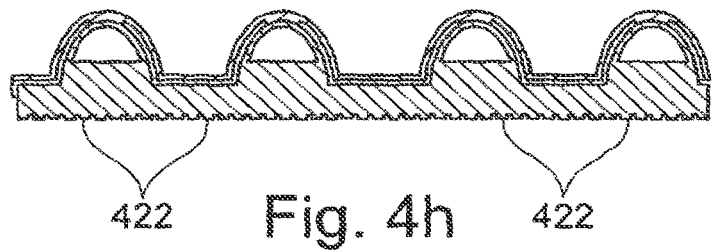

In FIG. 4h the emitting face 422 of the GaN layer is shown to be structured by etching where it may be patterned to form refractive, diffractive, Fresnel or 2D photonic crystal structures.

Figure 5A:
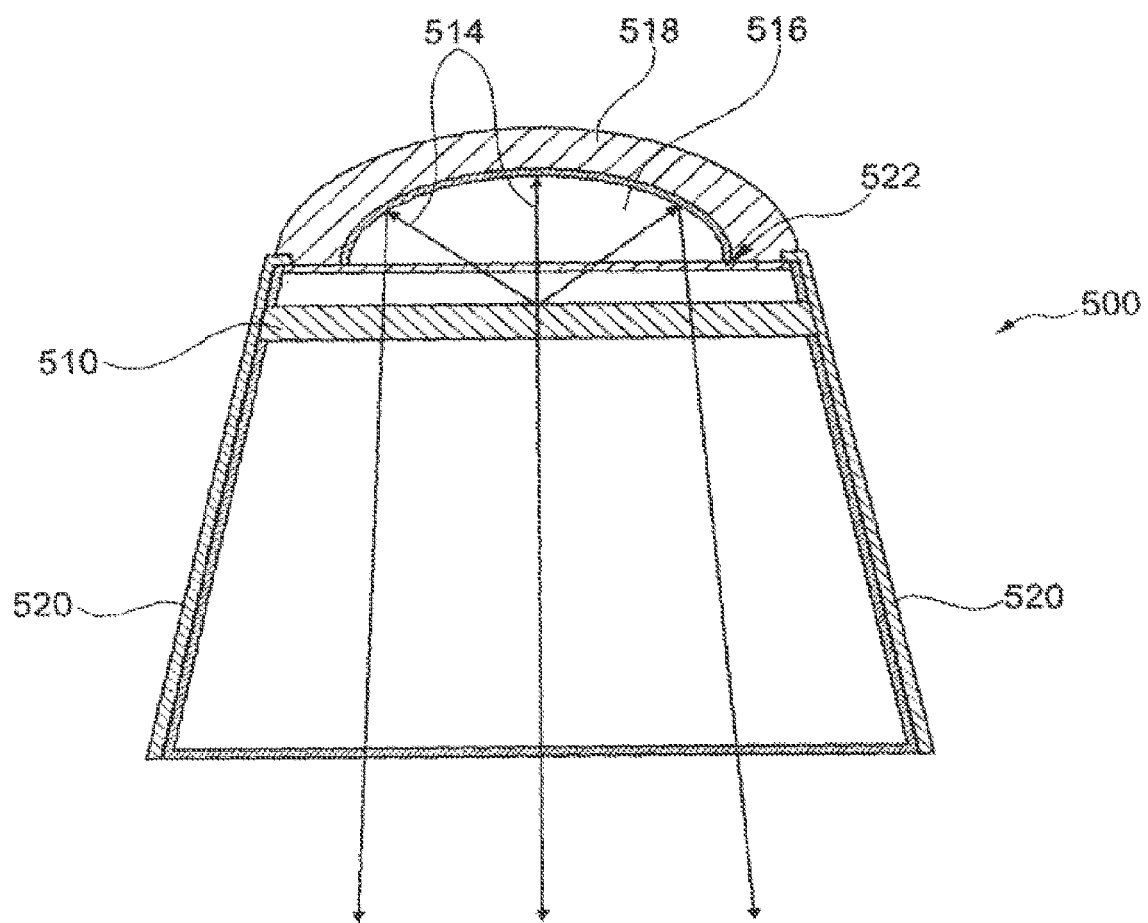
FIG. 5a is a representation of a light emitting structure according to an embodiment of the present invention.

FIG. 5a is a light emitting structure 500 according to the present invention. As shown in FIG. 5 the light emitting structure 500 comprises a light generating quantum well region 510 which, for example, is typically less than 100 nm thick and is made from InGaN. Light 514 is emitted from the light generating quantum well region 510 and passes through a transparent conductive layer 516 which may be made from a visibly transparent conductive oxide. As shown there is also a transparent conductive layer 522. The light rays 514 are then reflected from a metal/contact curved mirror 518. The light emitting structure 500 also has a side wall oxide 520.

Figure 5B:
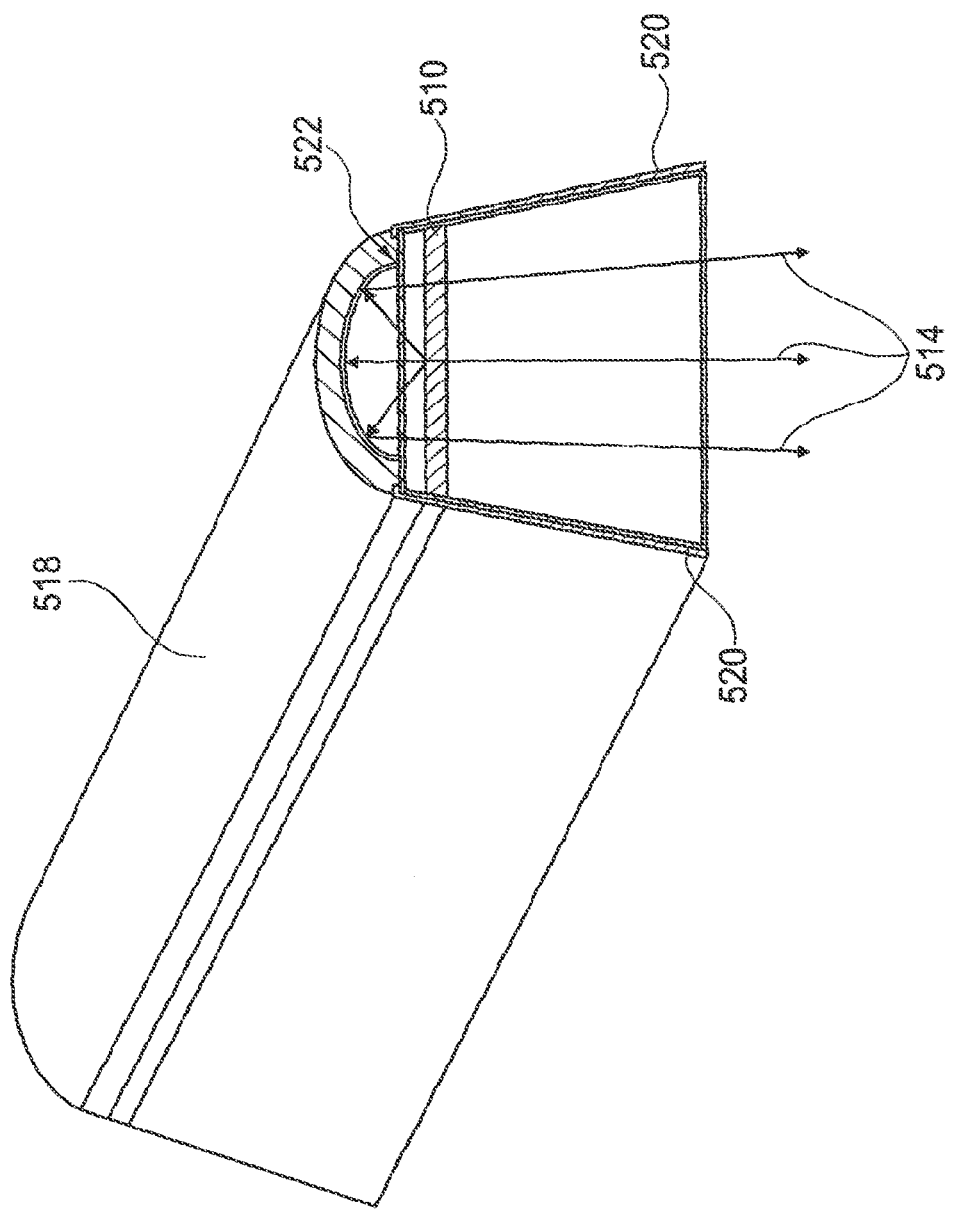
FIG. 5b is a representation of the embodiment shown in FIG. 5a deployed in a linear structure according to an embodiment of the present invention.

FIG. 5b shows a variant where a light emitting structure is in the form of a linear device where there is an extended metal/contact curved mirror 518. As before there is a quantum well region 510, sidewalls 520 and a transparent conductive layer 522.

Figure 6:
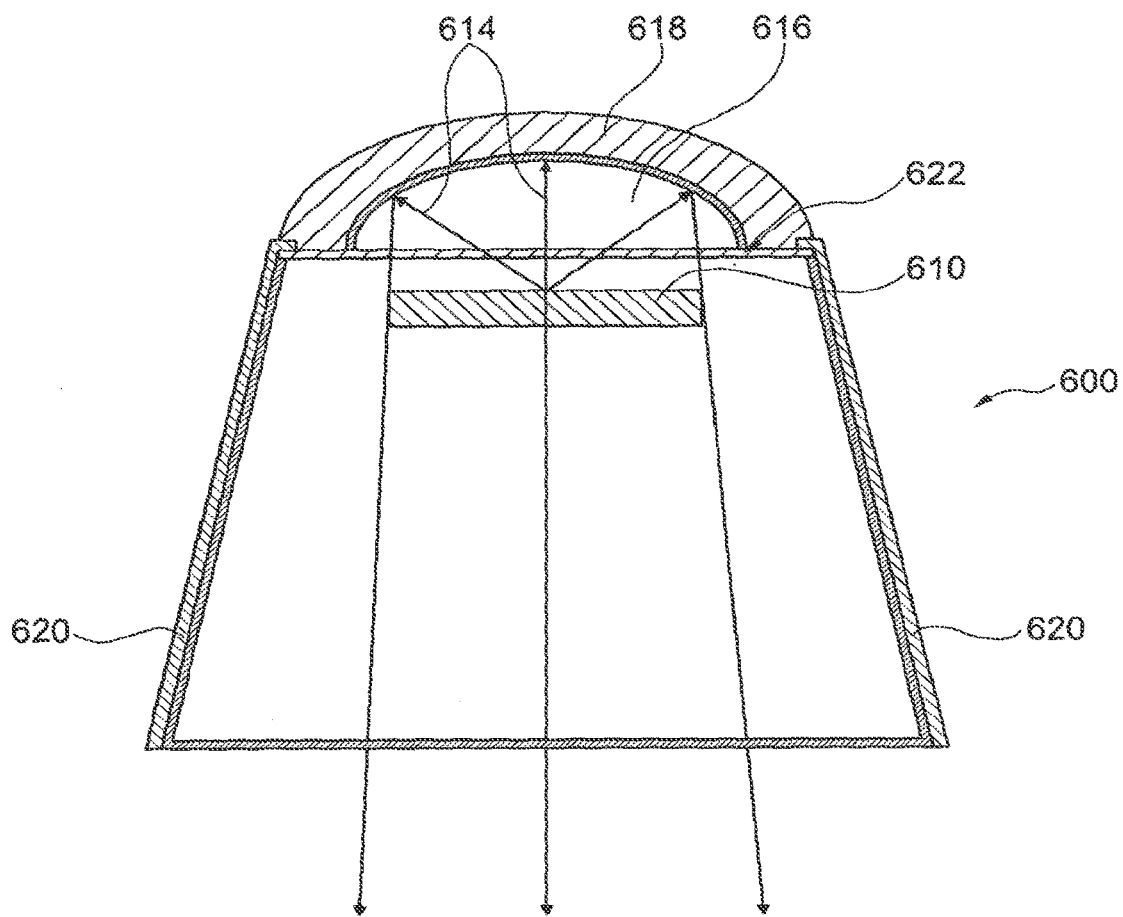
FIG. 6 is a representation of a light emitting structure where the quantum well area has been reduced according to an embodiment of the present invention.

In comparison, in FIG. 6 there is shown an embodiment where there is shown a light emitting structure 600 with a reduced quantum well area. The light emitting structure 600 has a light generating quantum well region 610 which, for example, is typically less than 100 nm thick and is made from InGaN. There is also a transparent dome cross-sectional cap 616 through which light 614 passes. As shown there is also a transparent conductive layer 622. The light rays 614 are then reflected from a metal/contact curved mirror 618. The light emitting structure 600 also has a side wall oxide 620. The point to note in the light emitting structure 600 is that the quantum well area 610 has been reduced to improve confinement of the light emission area to the centre of the pixel allowing more effective beam extraction from a shaped metal/contact curved mirror 618. For a 2 dimensional parabolic shape reflected light 614 will be near collimated. In this form, the p-GaN region and quantum well 610 are selectively exposed to a plasma treatment. This has the effect of stopping light emission from the treated area i.e. reducing the size of the active layer such that the light generated is close to the middle area of the active area. For the parabolic shaped reflector 618 this would coincide with the focal point. The application of the reduced quantum well area can be utilised with a conventional 'flat' topped structure as long as the sidewalls are sloped, but preferably should be used with a cap structure as described.

Figure 7:
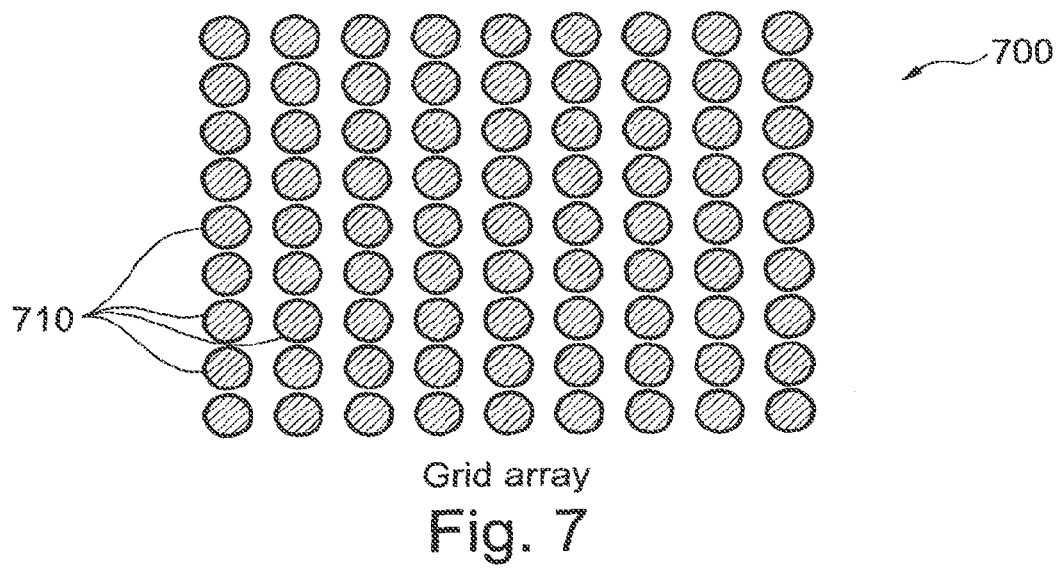
FIG. 7 is a grid array of light emitting structures according to an embodiment of the present invention.
Figure 8:
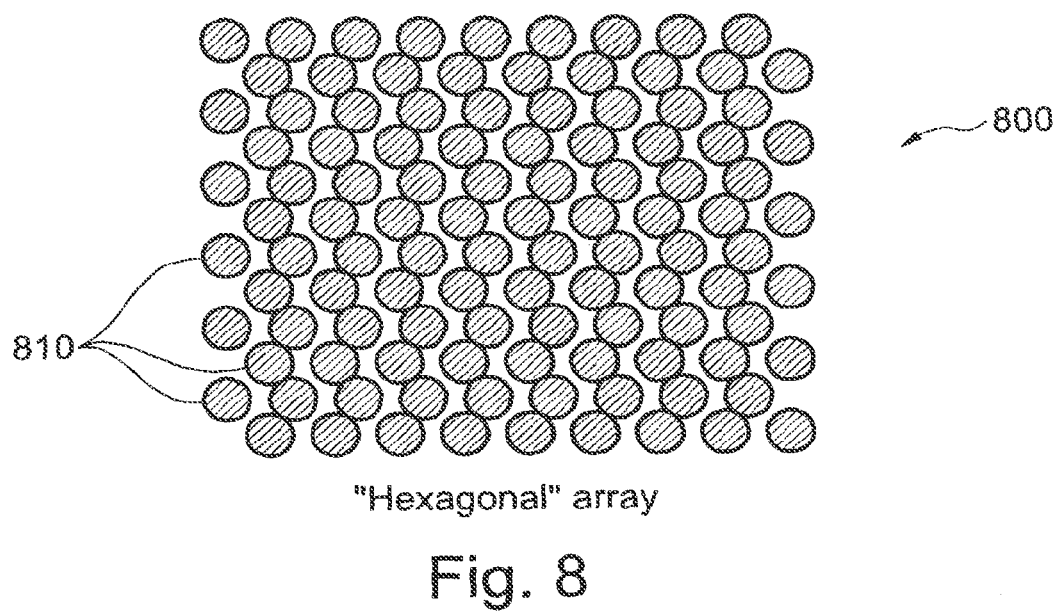
FIG. 8 is a hexagonal array of light emitting structures according to a further embodiment of the present invention.
Figure 9:
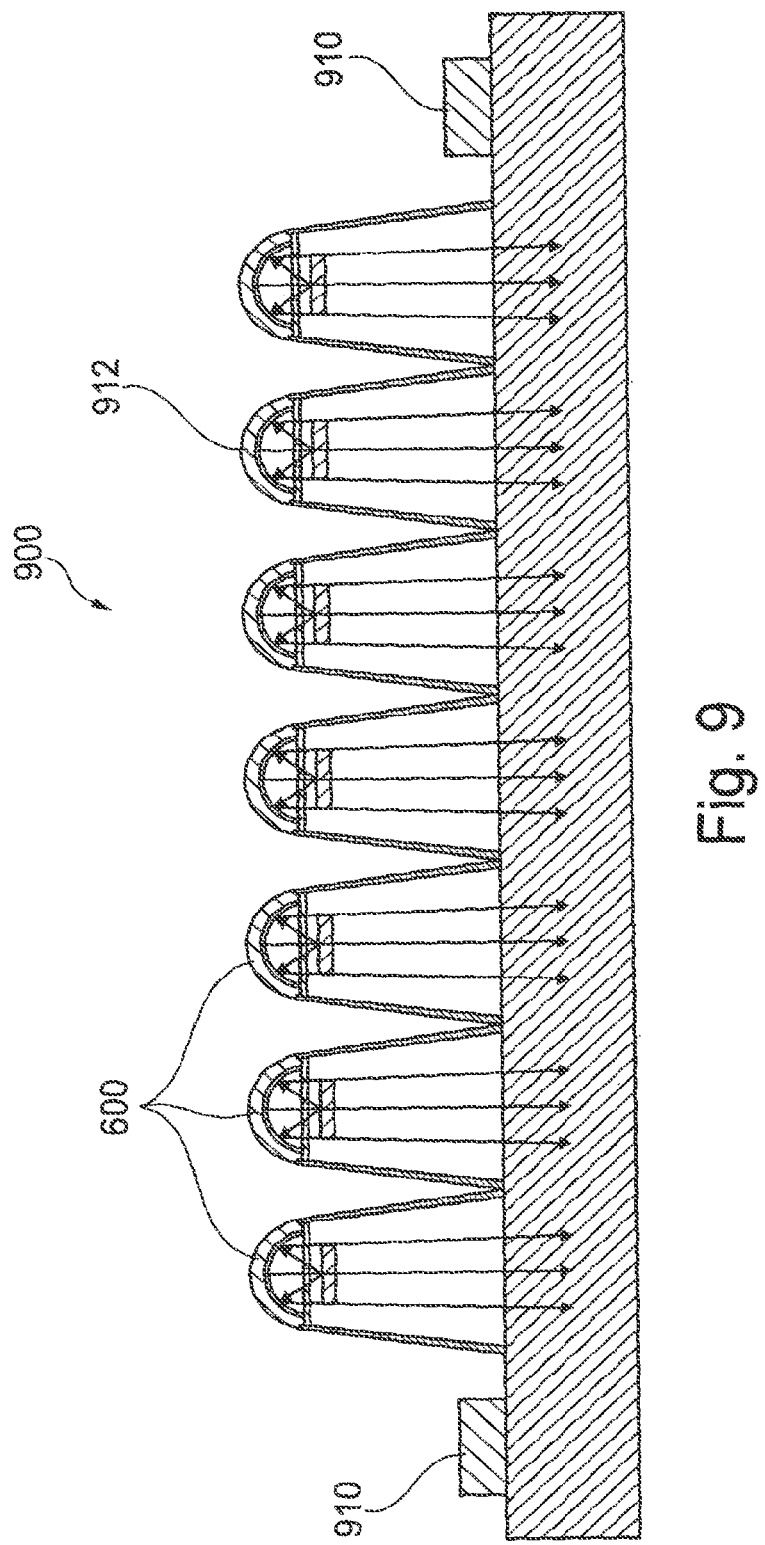
FIG. 9 is a representation of a plurality of light emitting structures of the present invention joined together according to a further embodiment of the present invention.

FIG. 7 is a grid array 700 of light emitting structures 710 of the present invention. FIG. 8 is a hexagonal array of 800 of light emitting structures 810 of the present invention. As shown in FIG. 9 multiple shaped emitter regions may be placed in an array 900 to form a common emitter area. In this format p and/or n contact areas may be addressed either by a common connection or on an individual basis. Emitter sites may be formed in a grid structure or a close packed 'hexagonal' array. FIG. 9 shows the n-contact regions 910 and the p-contact regions 912. FIG. 9 also shows in this case that there are seven light emitting structures as shown in FIG. 6 but the number may be more.

Figure 10:
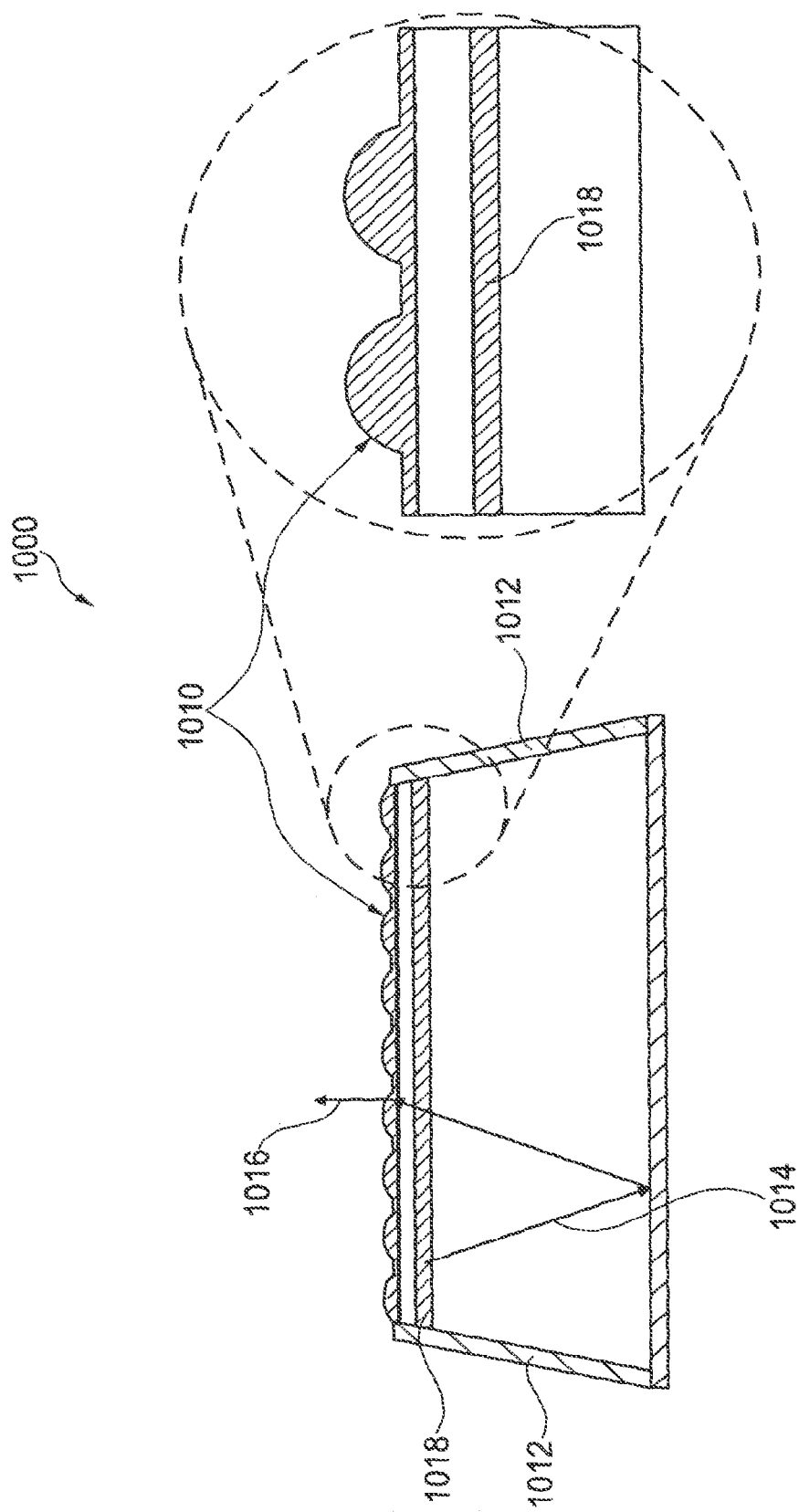
FIG. 10 is a representation of a cap layer with an array of domed structures (e.g. spherical) and adjacent conductive layers which provide electrical contact and reduce Fresnel reflections at this interface by design wherein a reflective structure is formed on the substrate so that light is output from the top surface according to a further embodiment of the present invention.

FIG. 10 shows a light emitting structure 1000 applicable to a top emission device where the transparent conductive layer 1010 has been structured in order to enhance light emission. The transparent conductive layer 1010 between structures should be of a thickness chosen to aid light transmission at the chosen wavelength.

There is also shown side wall oxides 1012 and light rays 1014, 1016. The light emitting structure 1000 as before also has a quantum well area 1018. The light generated in the quantum well area 1018 is typically less than 0.5 micron from the GaN surface. The layer thickness of the transparent conductive layer 1010 is determined by the wavelength with the thickness being chosen to reduce reflection. An optional mirror as shown at the bottom of the light emitting structure 1000 shown in FIG. 10 may also be used.

Whilst specific embodiments of the present invention have been described above, it will be appreciated that departures from the described embodiments may still fall within the scope of the present invention. For example, any suitable type of integrated transparent conductive layer and transparent conductive layer (e.g. transparent cap) may be used.

The invention claimed is:

1. A light emitting device, comprising:
a light emitting structure configured to generate light, the light emitting structure including a first side and a second side, the second side including a light emitting surface through which the light is emitted, the light emitting structure further including a sidewall between the first and second sides; and
an ohmic contact to the light emitting structure, including:
a transparent electrically conductive layer above the light emitting structure at the first side; and
a metal layer above the transparent electrically conductive layer, the light generated by the light emitting structure being transmitted through the transparent electrically conductive layer in first directions and reflected by the metal layer in second directions back through the transparent electrically conductive layer and the light emitting structure to the light emitting surface, wherein the transparent electrically conductive layer over the light emitting structure and the sidewall of the light emitting structure include a domed cross-section shape.

2. The light emitting device of claim 1, wherein the domed cross-section shape causes the light in the second directions to include a reduced divergence relative to the light in the first directions.

3. The light emitting device of claim 1, wherein the sidewall is sloped to reflect at least a portion of the light generated by the light emitting structure.

4. The light emitting device of claim 3, wherein the sidewall includes oxide.

5. The light emitting device of claim 1, wherein the light emitting structure includes:
a semiconductor structure; and
a quantum well region defined in the semiconductor structure, the quantum well region configured to generate the light.

6. The light emitting device of claim 5, wherein the semiconductor structure includes GaN and the quantum well region includes InGaN.

7. The light emitting device of claim 5, wherein the quantum well region has a width defined in a dimension along the light emitting surface that is smaller than a width of the semiconductor structure.

8. The light emitting device of claim 5, wherein the quantum well region has a width defined in a dimension along the light emitting surface that is smaller than 100 nm.

9. The light emitting device of claim 5, wherein the transparent electrically conductive layer shapes current distribution to reduce surface recombination at an outer periphery of the quantum well.

10. The light emitting device of claim 1, further comprising:
a substrate at the second side of the light emitting structure; and
a second contact to the light emitting structure on the substrate.

11. The light emitting device of claim 10, wherein the ohmic contact is a p-contact and the second contact is an n-contact.

12. The light emitting device of claim 1, wherein the transparent electrically conductive layer includes one of Indium Tin Oxide or doped conductive Zinc-Oxide.

13. The light emitting device of claim 1, wherein the metal layer is over at least a portion of the sidewall.

14. The light emitting device of claim 1, wherein the transparent electrically conductive layer reduces Fresnel reflections at an interface of the transparent electrically conductive layer and the light emitting structure.

15. An electronic device, comprising:
a substrate; and
a plurality of light emitting devices on the substrate, each light emitting device including:
a light emitting structure configured to generate light, the light emitting structure including a first side and a second side, the second side including a light emitting surface through which the light is emitted, the light emitting structure further including a sidewall between the first and second sides; and
an ohmic contact to the light emitting structure, including:
a transparent electrically conductive layer above the light emitting structure at the first side; and
a metal layer above the transparent electrically conductive layer, the light generated by the light emitting structure being transmitted through the transparent electrically conductive layer in first directions and reflected by the metal layer in second directions back through the transparent electrically conductive layer and the light emitting structure to the light emitting surface,
wherein the transparent electrically conductive layer over the light emitting structure and the sidewall of the light emitting structure include a domed cross-section shape.

16. The electronic device of claim 15, further comprising a second contact to the light emitting structures of the plurality of light emitting devices, the second contact on the substrate, the ohmic contacts of the light emitting devices being p-contacts and the second contact being an n-contact shared by the plurality of light emitting devices.

17. The electronic device of claim 15, wherein the domed cross-section shape causes the light in the second directions to include a reduced divergence relative to the light in the first directions.

18. The electronic device of claim 17, wherein the sidewall is sloped to reflect at least a portion of the light generated by the light emitting structure.

* * * * *